(12) United States Patent
Ruckerbauer et al.

(10) Patent No.: US 7,560,807 B2
(45) Date of Patent: Jul. 14, 2009

(54) ARRANGEMENT OF SEMICONDUCTOR MEMORY DEVICES AND SEMICONDUCTOR MEMORY MODULE COMPRISING AN ARRANGEMENT OF SEMICONDUCTOR MEMORY DEVICES

(75) Inventors: Hermann Ruckerbauer, Moos (DE); Holger Schroeter, Munich (DE)

(73) Assignee: Qimonda AG, Munich (DE)

( * ) Notice: Subject to any disclaimer, the term of this patent is extended or adjusted under 35 U.S.C. 154(b) by 107 days.

(21) Appl. No.: 11/638,310

(22) Filed: Dec. 12, 2006

(65) Prior Publication Data
US 2007/0228436 A1    Oct. 4, 2007

(30) Foreign Application Priority Data
Dec. 12, 2005   (DE) ................. 10 2005 059 189

(51) Int. Cl.
    *H01L 23/02* (2006.01)
(52) U.S. Cl. ..................... 257/686; 257/773
(58) Field of Classification Search ............. 257/686, 257/692, 697, 698, 723, 737, 753, 758, 773, 257/777, E23.021, E23.042, 688, 693, 700, 257/730, 774, E23.004, E23.062, E23.067, 257/738; 438/108, 109; 361/749
See application file for complete search history.

(56) References Cited

U.S. PATENT DOCUMENTS

| | | | | |
|---|---|---|---|---|
| 6,064,114 | A  * | 5/2000 | Higgins, III | 257/698 |
| 6,576,992 | B1 * | 6/2003 | Cady et al. | 257/686 |
| 2006/0175693 | A1 * | 8/2006 | Cady et al. | 257/686 |
| 2006/0192277 | A1 * | 8/2006 | RaghuRam | 257/686 |
| 2007/0018303 | A1 * | 1/2007 | Lee | 257/686 |
| 2008/0079132 | A1 * | 4/2008 | Goodwin | 257/686 |

FOREIGN PATENT DOCUMENTS

WO    WO 2004/032206 A1    4/2004

* cited by examiner

*Primary Examiner*—Steven Loke
*Assistant Examiner*—Suberr Chi
(74) *Attorney, Agent, or Firm*—Slater & Matsil, L.L.P.

(57) ABSTRACT

An arrangement of semiconductor memory devices includes a first semiconductor memory device and a second semiconductor memory device. The arrangement of semiconductor memory devices also has a flexible substrate. A first electrically conductive conductor track is arranged in the flexible substrate. At least one first contact of the flexible substrate is coupled to the at least one second contact of the second semiconductor memory device through the first electrically conductive conductor track. A second electrically conductive conductor track is arranged in the flexible substrate.

20 Claims, 3 Drawing Sheets

US 7,560,807 B2

ARRANGEMENT OF SEMICONDUCTOR MEMORY DEVICES AND SEMICONDUCTOR MEMORY MODULE COMPRISING AN ARRANGEMENT OF SEMICONDUCTOR MEMORY DEVICES

This application claims priority to German Patent Application 10 2005 059 189.2, which was filed Dec. 12, 2005, and is incorporated herein by reference.

TECHNICAL FIELD

The present invention relates to an arrangement of semiconductor memory devices and a semiconductor memory module comprising an arrangement of semiconductor memory devices. The invention relates in particular to semiconductor memory devices which are connected to one another via a flexible substrate.

BACKGROUND

A semiconductor memory module typically comprises a printed circuit board and a plurality of semiconductor memory components mounted thereon. The semiconductor memory module may furthermore comprise a control component, for example a HUB chip, and also a bus system, the control component controlling read and write access to the semiconductor memory components by means of control signals transmitted via the bus system.

In order to increase the storage density of the semiconductor memory module, the semiconductor memory components preferably comprise a plurality of semiconductor memory devices arranged in housings stacked one above another.

FIG. 1 shows a cross-sectional view of a semiconductor memory component 2 comprising a first 50 and a second 60 semiconductor memory device, the second semiconductor memory device 60 being arranged on the first semiconductor memory device 50. Each of the semiconductor memory devices 50 and 60 has a housing 55 and 65 and an underside 56 and 66. Each of the housings 55 and 65 has a top side 58 and 68. Situated in the housing 55 and 65 is an integrated semiconductor memory chip 52 and 62 mounted on a printed circuit board (not shown in FIG. 1). A plurality of semiconductor memory chips 52 and 62 may also be arranged one above another in each of the housings 55 and 65.

Each of the semiconductor memory devices 50 and 60 has, at the underside 56 and 66, connection contacts 53 and 63 connected to the semiconductor memory chips 52 and 62 via bonding wires (not shown in FIG. 1) arranged in a potting compound 54 and 64. Each of the connection contacts 53 and 63 of the semiconductor memory devices 50 and 60 is connected to respective external contacts 51 and 61 of the semiconductor memory devices 50 and 60. The external contacts 51 and 61 of the semiconductor memory devices 50 and 60 are preferably formed as solder balls. A filler material 57 and 67 is provided between the individual external contacts 51 and 61.

The external contacts 51 and 61 of the semiconductor memory devices 50 and 60 are in each case organized in groups of first external contacts 51a and 61a and second external contacts 51b and 61b of the semiconductor memory devices 50 and 60. The first external contacts 51a and 61a of the semiconductor memory devices 50 and 60 are arranged on respective first sections of the semiconductor memory devices 50 and 60 as a matrix in the vicinity of first lateral ends 59a and 69a of the semiconductor memory devices 50 and 60. The second external contacts 51b and 61b of the semiconductor memory devices 50 and 60 are arranged on respective second sections of the semiconductor memory devices 50 and 60 as a matrix in the vicinity of second lateral ends 59b and 69b of the semiconductor memory devices 50 and 60. In the present cross-sectional view, each matrix comprises three columns and, by way of example, eleven rows (not shown in FIG. 1).

The first external contacts 61a of the second semiconductor memory device 60 are connected to first contacts 70a of the semiconductor memory component 2 via electrically conductive conductor tracks 81a. The electrically conductive conductor tracks 81a are arranged on a surface of a first flexible substrate 82a.

A first end section of the first flexible substrate 82a is arranged between the top side 58 of the first section of the first semiconductor memory device 50 and the underside 66 of the first section of the second semiconductor memory device 60. The first end section of the first flexible substrate 82a is fixed at the top side 58 of the first semiconductor memory device 50 by means of a first adhesion agent 80a.

A second end section of the first flexible substrate 82a is arranged between the first external contacts 51a of the first semiconductor memory device 50 and the first contacts 70a of the semiconductor memory component 2.

The second external contacts 61b of the second semiconductor memory device 60 are connected to second contacts 70b of the semiconductor memory component 2 via electrically conductive conductor tracks 81b. The electrically conductive conductor tracks 81b are arranged on a surface of a second flexible substrate 82b.

A first end section of the second flexible substrate 82b is arranged between the top side 58 of the second section of the first semiconductor memory device 50 and the underside 66 of the second section of the second semiconductor memory device 60. The end section of the second flexible substrate 82b is fixed at the top side 58 of the first semiconductor memory device 50 by means of a second adhesion agent 80b.

A second end section of the second flexible substrate 82b is arranged between the second external contacts 51b of the first semiconductor memory device 50 and the second contacts 70b of the semiconductor memory component 2.

An electrically conductive connection between the first external contacts 61a of the second semiconductor memory device 60 and the first contacts 70a of the semiconductor memory component 2 is provided via the electrically conductive conductor track 81a arranged in the first flexible substrate 82a.

An electrically conductive connection between the second external contacts 61b of the second semiconductor memory device 60 and the second contacts 70b of the semiconductor memory component 2 is provided via the electrically conductive conductor track 81b arranged in the second flexible substrate 82b.

By contrast, the first 51a and second 51b external contacts of the first semiconductor memory device 50 are connected almost directly to the respective first 70a and second contacts 70b of the semiconductor memory component 2 via plated-through holes through the flexible substrates 82a and 82b.

The first contacts 70a of the semiconductor memory component 2 serve as input contacts of the semiconductor memory component 2 in order to receive signals from the control component (not shown in FIG. 1). The signals are transmitted to the respective first external contacts 51a and 61a of the first 50 and second 60 semiconductor memory devices via the respective electrically conductive connections. The second contacts 70b of the semiconductor component 2 serve as output contacts of the semiconductor component 2 in order to transmit signals proceeding from the second external contacts 51b and 61b from the first 50 and, respectively, the second 60, semiconductor memory device to the control component (not shown in FIG. 1).

In the case of this arrangement, data signals, proceeding from the control component, run via the first contacts 70a of the semiconductor memory component 2 in parallel through the first 50 and the second 60 semiconductor memory device before they are transmitted to the control component via the second contacts 70b of the semiconductor memory component 2.

On account of the different length of the connection between the control component and the first semiconductor memory device 50 and the connection between the control component and the second semiconductor memory device 60, signal propagation time differences arise.

Therefore, there is a need to provide an improved arrangement of semiconductor memory devices Furthermore, there is a need to provide an improved semiconductor memory module in which the signal quality of a data transmission between a control component and a memory component is improved.

SUMMARY OF THE INVENTION

One embodiment of the invention provides an arrangement of semiconductor memory devices. The arrangement of semiconductor memory devices comprise a first semiconductor memory device having an underside, at least one first contact being provided on a first section of the underside of the first semiconductor memory device, and at least one second contact being provided on a second section of the underside of the first semiconductor memory device.

The arrangement of semiconductor memory devices further comprises a second semiconductor memory device having an underside, at least one first contact being provided on a first section of the underside of the second semiconductor memory device, and at least one second contact being provided on a second section of the underside of the second semiconductor memory device.

The arrangement of semiconductor memory devices additionally comprises a flexible substrate having an underside, the flexible substrate having a first section and a second section.

At least one first contact is arranged on the underside of the first section of the flexible substrate and at least one second contact is arranged on the underside of the second section of the flexible substrate. The first semiconductor memory device is arranged on the first and second sections of the flexible substrate, and the second semiconductor memory device is arranged on the first semiconductor memory device.

A first electrically conductive conductor track is arranged in the flexible substrate. The at least one first contact of the flexible substrate is connected to the at least one second contact of the second semiconductor memory device via the first electrically conductive conductor track.

A second electrically conductive conductor track is arranged in the flexible substrate. The at least one first contact of the second semiconductor memory device is connected to the at least one second contact of the first semiconductor memory device via the second electrically conductive conductor track.

A third electrically conductive conductor track is arranged in the flexible substrate, the third electrically conductive conductor track comprising a plated-through hole through the flexible substrate. The at least one first contact of the first semiconductor memory device is connected to the at least one second contact of the flexible substrate via the third electrically conductive conductor track.

In the arrangement of semiconductor memory devices according to the invention signals pass through the second semiconductor memory device and the first semiconductor memory device serially and consequently, no propagation time differences occur between signals from the first and second semiconductor memory devices.

A further embodiment of the invention provides a semiconductor memory module. The semiconductor memory module comprises at least one arrangement of semiconductor memory devices in accordance with one embodiment of the invention, a control component, a printed circuit board and at least one bus system, the arrangement of semiconductor memory devices and the control component being arranged on the printed circuit board, and the control component controlling read and write access to the arrangement of semiconductor memory devices by means of control signals transmitted via the bus system.

In the semiconductor memory module according to embodiments of the invention signals, proceeding from the control component, pass through the second semiconductor memory device and the first semiconductor memory device serially and consequently, no propagation time differences occur between signals from the first and second semiconductor memory devices which are transmitted to the memory component.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 2:
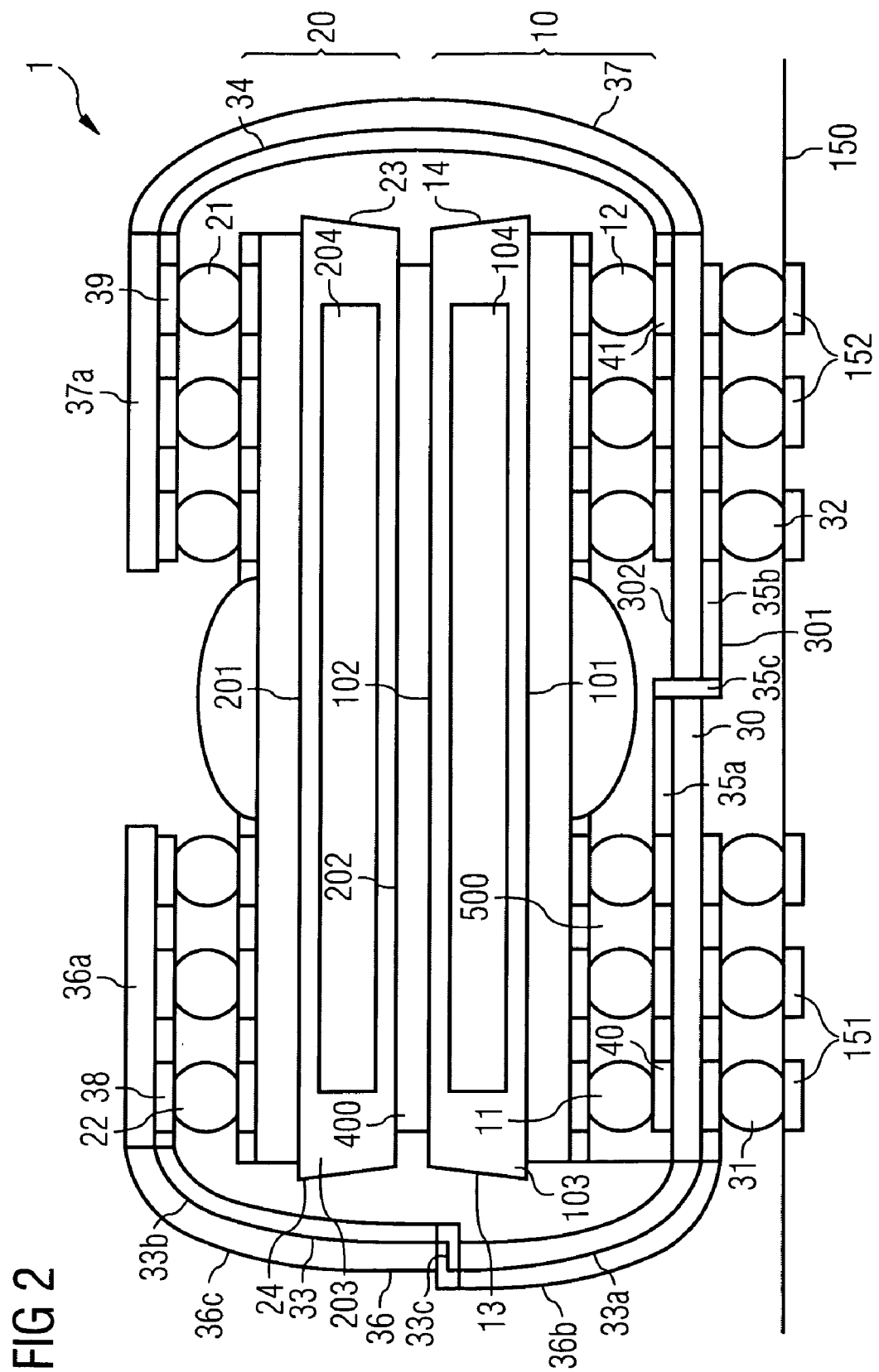
FIG. 2 shows a cross-sectional view of an arrangement of semiconductor memory devices in accordance with one embodiment of the invention.

FIG. 2 shows a cross section of an arrangement 1 of semiconductor memory devices 10 and 20 in accordance with one embodiment of the invention. An arrangement 1 of semiconductor memory devices is arranged on a printed circuit board 150. The arrangement 1 of semiconductor memory devices comprises a first semiconductor memory device 10, a second semiconductor memory device 20 and a flexible substrate 30. Each of the first 10 and second 20 semiconductor memory devices is formed as a chip scale package (CSP), or more precisely as a fine pitch ball grid array (FBGA). This arrangement has the advantage in comparison with a thin small outline package (TSOP) that the contacts of the semiconductor arrangement are arranged on an underside of the semiconductor memory device and consequently, the space requirement is determined by the dimensions of the chip encapsulated in a housing of the semiconductor memory device.

The first 10 and the second 20 semiconductor memory devices in each case have a housing 103 and 203, a top side 102 and 202 and an underside 101 and 201. Each of the first 10 and the second 20 semiconductor memory devices has an integrated semiconductor component 104 and 204 arranged in the respective housings 103 and 203. The integrated semiconductor components 104 and 204 may comprise dynamic random access memory cells.

The flexible substrate 30 has an underside 301 and a top side 302. First contacts 31 are arranged on the underside 301 on a first section of the flexible substrate 30 and second contacts 32 are arranged on the underside 301 on a second section of the flexible substrate 30. The first contacts 31 on the underside 301 of the flexible substrate 30 are coupled to first contacts 151 of the printed circuit board 150. The second contacts 32 on the underside 301 of the flexible substrate 30 are coupled to second contacts 152 of the printed circuit board 150.

The first contacts 31 of the flexible substrate 30 serve as input contacts for the arrangement 1 of semiconductor memory devices. The second contacts 32 of the flexible substrate 30 serve as output contacts of the arrangement 1 of semiconductor memory devices.

According to the invention, signals, proceeding from a control component (not shown in FIG. 2) pass serially through the first contacts 31 of the flexible substrate 30, the second semiconductor memory device 20 and the first semiconductor memory device 10 before they are transmitted to the control component (not shown in FIG. 2) via the second contacts 32 of the flexible substrate 30.

The first semiconductor memory device 10 is arranged on the first and second sections of the flexible substrate 30, the underside 101 of the first semiconductor memory device 10 facing the top side 302 of the flexible substrate 30. The second semiconductor memory device 20 is arranged on the first semiconductor memory device 10, the top side 202 of the second semiconductor memory device 20 facing the top side 102 of the first semiconductor memory device 10. An adhesion agent 400 is provided on the top side 102 of the first semiconductor memory device 10, and fixes the top side 202 of the second semiconductor memory device 20 on the top side 102 of the first semiconductor memory device 10.

First contacts 11 of the first semiconductor memory device 10 are arranged on a first section of the underside 101 of the first semiconductor memory device 10. Second contacts 12 of the first semiconductor memory device 10 are arranged on a second section of the underside 101 of the first semiconductor memory device 10.

Between the top side 302 of the flexible substrate 30 and the underside 101 of the first semiconductor memory device 10, a filler material 500 is arranged between the first contacts 11 and between the second contacts 12 of the first semiconductor memory device 10.

The first contacts 11 and the second contacts 12 of the first semiconductor memory device 10 are connected to the integrated semiconductor component 104 via a printed circuit board (not shown in FIG. 2) arranged on the underside 101 of the semiconductor memory device 10 and via bonding wires (not shown in FIG. 2) which connect the printed circuit board to contacts (not shown in FIG. 2) of the integrated semiconductor component 104. The first contacts 11 of the first semiconductor memory device 10 serve as output contacts of the first semiconductor memory device 10. The second contacts 12 of the first semiconductor memory device 10 serve as input contacts of the first semiconductor memory device 10. An operative connection is provided between the first contacts 11 and the second contacts 12 of the first semiconductor memory device 10 via the integrated semiconductor component 104.

First contacts 21 of the second semiconductor memory device 20 are arranged on a first section of the underside 201 of the second semiconductor memory device 20. Second contacts 22 of the second semiconductor memory device 20 are arranged on a second section of the underside 201 of the second semiconductor memory device 20.

The first contacts 21 and the second contacts 22 of the second semiconductor memory device 20 are connected to the integrated semiconductor memory component 204 via a printed circuit board (not shown in FIG. 2) arranged on the underside 201 of the second semiconductor memory device 20 and via bonding wires (not shown in FIG. 2) which connect the printed circuit board to contacts (not shown in FIG. 2) of the integrated semiconductor component 204. The second contacts 22 of the second semiconductor memory device 20 serve as input contacts of the second semiconductor memory device 20. The first contacts 21 of the second semiconductor memory device 20 serve as output contacts of the second semiconductor memory device 20. An operative connection is provided between the first contacts 21 and the second contacts 22 of the second semiconductor memory device 20 via the integrated semiconductor component 204.

The flexible substrate 30 has an electrically insulating material and electrically conductive conductor tracks 33, 34 and 35, the electrically conductive conductor tracks 33, 34 and 35 being arranged in a manner electrically insulated from one another. The electrically conductive conductor tracks 33, 34 and 35 may contain copper or some other suitable conductive material. The electrically insulating material of the flexible substrate 30 may contain polyimide by way of example. The electrically conductive conductor tracks 33, 34, 35 may be arranged in the flexible substrate 30, between the top side 302 and the underside 301 of the flexible substrate 30 or be arranged on the top side 302 of the flexible substrate 30 or on the underside 301 of the flexible substrate 30.

Each of the first contacts 31 of the flexible substrate 30 is connected to assigned to the second contacts 22 of the second semiconductor memory device 20 via assigned first electrically conductive conductor tracks 33 of the flexible substrate 30.

The flexible substrate 30 has a third section 36, which is adjacent to the first section of the flexible substrate 30 and runs along a first lateral end 13 of the first semiconductor memory device 10 and along a second lateral end 24 of the second semiconductor memory device 20. On an end section 36a of the third section 36 of the flexible substrate 30, connection contacts 38 are provided on the top side 302 of the flexible substrate 30, through which connection contacts the first electrically conductive conductor tracks 33 are connected to the assigned second contacts 22 of the second semiconductor memory device 20.

The end section 36a of the third section 36 of the flexible substrate 30 is arranged on the underside 201 of the second section of the second semiconductor memory device 20. The top side 302 of the end section 36a of the third section 36 of the flexible substrate 30 faces the underside 201 of the second section of the second semiconductor memory device 20.

Each of the first electrically conductive conductor tracks 33 has three sections 33a, 33b and 33c. The first section 33a of the first electrically conductive conductor track 33 is arranged on the underside 301 of a first partial section 36b of the third section 36 of the flexible substrate 30. The second section 33b of the first electrically conductive conductor track 33 is arranged on the top side 302 of a second partial section 36b of the third section 36 of the flexible substrate 30. The first 33a and the second 33b section of the first electrically conductive conductor track 33 are connected via the third section 33c of the first electrically conductive conductor track 33, the third section 33c of the first electrically conductive conductor track 33 being formed as a plated-through hole through the flexible substrate 33.

The first contacts 21 of the second semiconductor memory device 20 are connected to assigned second contacts 12 of the first semiconductor memory device 10 via assigned second electrically conductive conductor tracks 34.

The flexible substrate 30 has a fourth section 37 which is adjacent to the second section, and runs along a second lateral end 14 of the first semiconductor memory device 10 and along a first lateral end 23 of the second semiconductor memory device 20. On an end section 37a of the fourth section 37 of the flexible substrate 30, connection contacts 39 are provided on the top side 302 of the flexible substrate 30. Connection contacts 41 are provided on the top side 302 of the second section of the flexible substrate 30.

The first contacts 21 of the second semiconductor memory device 20 are connected to the second contacts 12 of the first semiconductor memory device 10 via the connection contacts 39 arranged on the end section 37a of the fourth section 37 of the flexible substrate 30 on the top side 302 of the flexible substrate 30, the second electrically conductive conductor tracks 34 and the connection contacts 41 arranged on the top side 302 of the second section of the flexible substrate 30.

The end section 37a of the fourth section 37 of the flexible substrate 30 is arranged on the underside 201 of the first section of the second semiconductor memory device 20. The top side 302 of the end section 37a of the fourth section 37 of the flexible substrate 30 faces the underside 201 of the first section of the second semiconductor memory device 20.

Connection contacts 40 are provided on the top side 302 of the first section of the flexible substrate 30, via which connection contacts the first contacts 11 of the first semiconductor memory device 10 are connected to the second contacts 32 of the flexible substrate 30 via respective third electrically conductive conductor tracks 35.

Each of the third electrically conductive conductor tracks 35 has three sections 35a, 35b and 35c. The first section 35a of the third electrically conductive conductor track 35 is arranged on the top side 302 of the first section of the flexible substrate 30. The second section 35b of the third electrically conductive conductor track 35 is arranged on the underside 301 of the second section of the flexible substrate 30. The first 35a and the second 35b section of the third conductive conductor track 35 are connected via the third section 35c of the third electrically conductive conductor track 35. The third section 35c of the third conductive conductor track 35 is formed as a plated-through hole through the flexible substrate 30.

Figure 3:
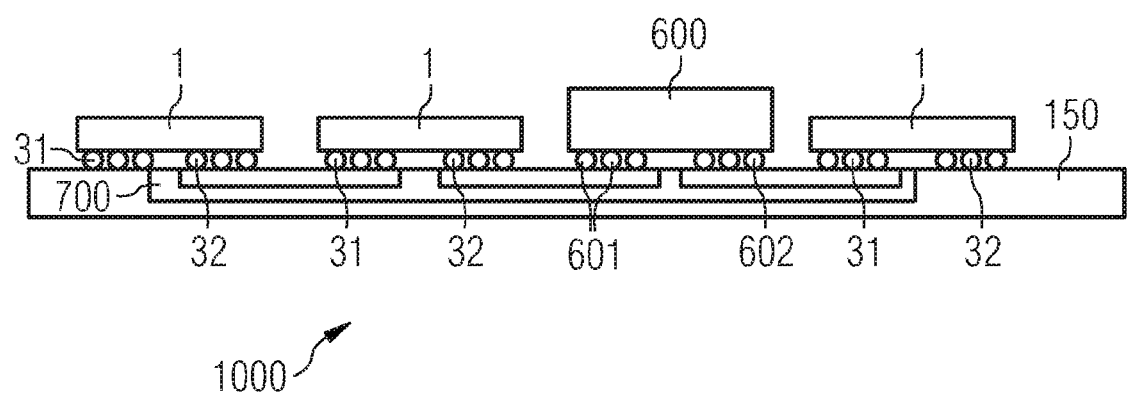
FIG. 3 shows a semiconductor memory module in accordance with one embodiment of the invention.

FIG. 3 shows a semiconductor memory module 1000 in accordance with one embodiment of the invention. The semiconductor memory module 1000 comprises a printed circuit board 150, on which a plurality of arrangements 1 of semiconductor memory devices in accordance with one embodiment of the invention and also a control component 600 are arranged. Each of the arrangements 1 of semiconductor memory devices is coupled via a first contact 31 of a flexible substrate 30 (not shown in FIG. 3) of the arrangement 1 of semiconductor memory devices and a second contact 32 of the flexible substrate 30 (not shown in FIG. 3) of the arrangement 1 of semiconductor memory devices to a bus system 700 arranged in the printed circuit board 150. The control component 600 is coupled to the bus system 700 via first 601 and second 602 control component contacts. The semiconductor memory module 1000 is preferably formed as a dual inline memory module.

The first contacts 31 of the flexible substrate 30 (not shown in FIG. 3) of each of the arrangements 1 of semiconductor arrangements serve as input contacts of the arrangements 1 of semiconductor arrangements via which a control signal is transmitted from the control component 600 to the semiconductor memory devices 10 and 20 (not shown in FIG. 3) of the arrangement 1 of semiconductor memory devices. In the arrangements 1 of semiconductor memory devices the signal passes serially first through the second semiconductor memory device 20 and then the first semiconductor memory device 10. Signals are transmitted from the semiconductor memory devices 10 and 20 to the control component 600 via the second contacts 32 of the flexible substrate 30 (not shown in FIG. 3) and the bus system 700.

Figure 1:
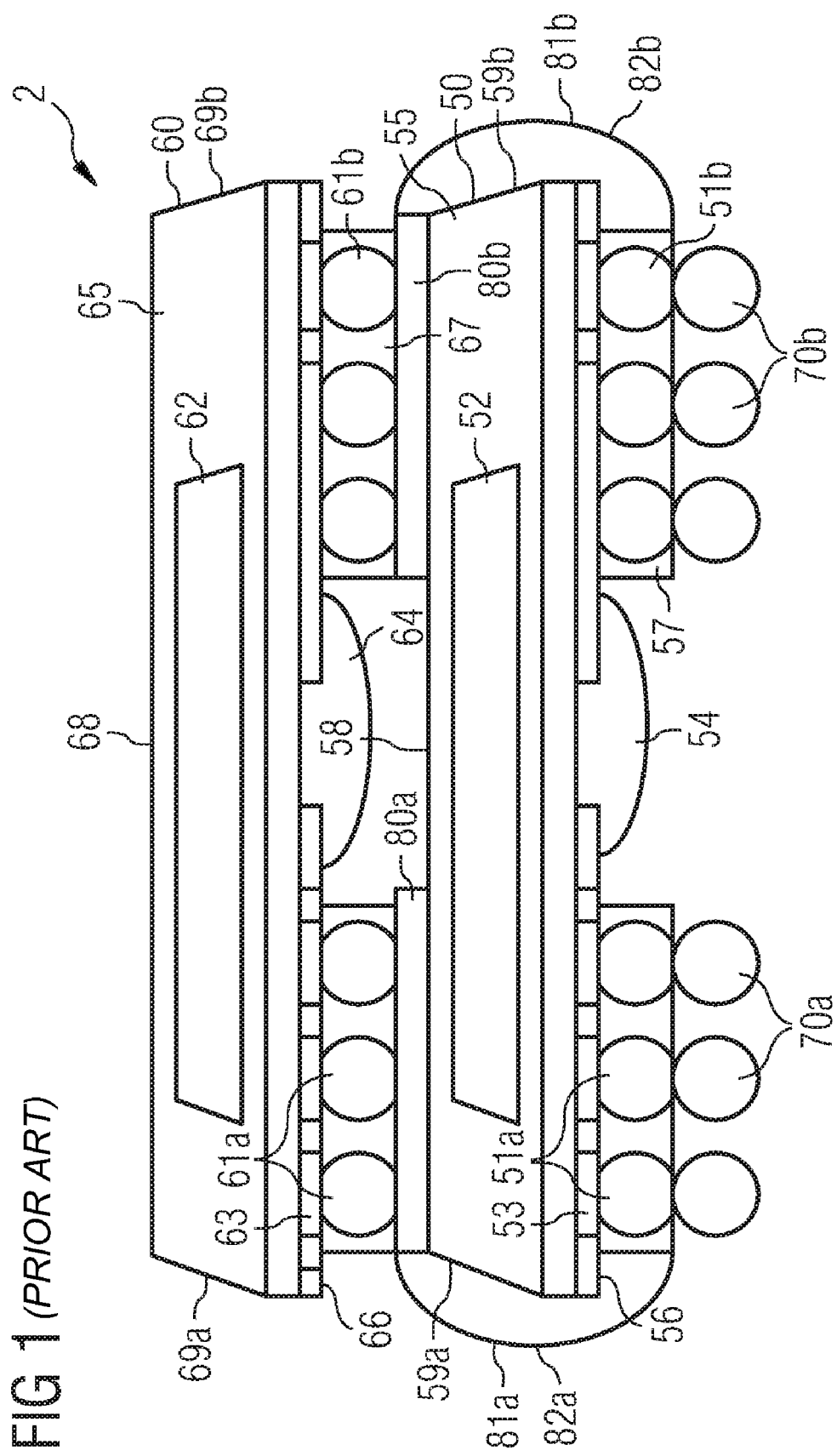
FIG. 1 shows a cross-sectional view of a known arrangement of semiconductor arrangements.

On account of the serial connection of the first semiconductor memory device 10 and the second semiconductor memory device 20, there are no problems with propagation time differences between signals as in the arrangement of semiconductor memory devices shown in FIG. 1, in which the signals run through the first 50 and the second 60 semiconductor memory device in parallel in the arrangement of semiconductor memory devices.

What is claimed is:

1. An arrangement of semiconductor memory devices, the arrangement comprising:

a first semiconductor memory device having an underside, at least one first contact being provided on a first section of the underside of the first semiconductor memory device, and at least one second contact being provided on a second section of the underside of the first semiconductor memory device;

a second semiconductor memory device having an underside, at least one first contact being provided on a first section of the underside of the second semiconductor memory device, and at least one second contact being provided on a second section of the underside of the second semiconductor memory device;

a flexible substrate having an underside, the flexible substrate having a first section and a second section, at least one first contact being arranged on the underside of the first section of the flexible substrate and at least one second contact being arranged on the underside of the second section of the flexible substrate;

the first semiconductor memory device being arranged on the first and second sections of the flexible substrate, and the second semiconductor memory device being arranged on the first semiconductor memory device;

a first electrically conductive conductor track arranged in the flexible substrate, the at least one first contact of the flexible substrate being coupled to the at least one second contact of the second semiconductor memory device through the first electrically conductive conductor track;

a second electrically conductive conductor track, arranged in the flexible substrate, the at least one first contact of the second semiconductor memory device is coupled to the at least one second contact of the first semiconductor memory device through the second electrically conductive conductor track; and a third electrically conductive conductor track, arranged in the flexible substrates, the third electrically conductive conductor track comprising a plated-through hole section, said plated-through hole section formed through the flexible substrate, the at least one first contact of the first semiconductor memory device is coupled to the at least one second contact of the flexible substrate through the third electrically conductive conductor track.

2. The arrangement of semiconductor memory devices as claimed in claim 1, wherein the flexible substrate has a top side, and the underside of the first semiconductor memory device is arranged on the top side of the first and second sections of the flexible substrate.

3. The arrangement of semiconductor memory devices as claimed in claim 1, wherein the first semiconductor memory device has a top side and the second semiconductor memory device has a top side, and the top side of the first semiconductor memory device faces the top side of the second semiconductor memory device.

4. The arrangement of semiconductor memory devices as claimed in claim 3, wherein an adhesion agent is provided between the top side of the first semiconductor memory device and the top side of the second semiconductor memory device.

5. The arrangement of semiconductor memory devices as claimed in claim 1, wherein the flexible substrate comprises a third section adjacent to the first section, an end section of the third section of the flexible substrate having at least one connection contact through which the first electrically conductive conductor track is coupled to the at least one second contact of the second semiconductor memory device.

6. The arrangement of semiconductor memory devices as claimed in claim 5, wherein the top side of the end section of the third section of the flexible substrate faces the underside of the second section of the second semiconductor memory device.

7. The arrangement of semiconductor memory devices as claimed in claim 6, wherein the at least one connection contact of the end section of the third section of the flexible substrate is arranged on the top side of the end section of the third section of the flexible substrate.

8. The arrangement of semiconductor memory devices as claimed in claim 1, wherein the flexible substrate comprises a third section adjacent to the first section, and a fourth section adjacent to the second section, an end section of the fourth section of the flexible substrate having at least one connection contact through which the second electrically conductive conductor track is connected to the at least one first contact of the second semiconductor device.

9. The arrangement of semiconductor memory devices as claimed in claim 8, wherein the top side of the end section of the fourth section of the flexible substrate faces the underside of the first section of the second semiconductor memory device.

10. The arrangement of semiconductor memory devices as claimed in claim 1, wherein at least one connection contact by which the third electrically conductive conductor track is coupled to the at least one first contact of the second semiconductor memory device is provided on the top side of the first section of the flexible substrate.

11. The arrangement of semiconductor memory devices as claimed in claim 1, wherein at least one connection contact by which the second electrically conductive conductor track is coupled to the at least one first contact of the second semiconductor memory device is provided on the top side of the second section of the flexible substrate.

12. The arrangement of semiconductor memory devices as claimed in claim 5, wherein the third section of the flexible substrate has a first and a second partial section and in which the first electrically conductive conductor track has a first section and a second section and the first section of the first electrically conductive conductor track is arranged on the underside of the first partial section of the third section of the flexible substrate.

13. The arrangement of semiconductor memory devices as claimed in claim 12, wherein the second section of the first electrically conductive conductor track is arranged on the top side of the second partial section of the third section of the flexible substrate.

14. The arrangement of semiconductor memory devices as claimed in claim 13, wherein the first electrically conductive conductor track has a third section, through which the first section is coupled to the second section of the electrically conductive conductor track.

15. The arrangement of semiconductor memory devices as claimed in claim 8, wherein the second electrically conductive conductor track is arranged on the top side of the fourth section of the flexible substrate.

16. The arrangement of semiconductor memory devices as claimed in claim 1, wherein the third electrically conductive conductor track has a first section and a second section, the first section of the third electrically conductive conductor track being arranged on the top side of the first section of the flexible substrate, and the second section of the third electrically conductive conductor track being arranged on the underside of the second section of the flexible substrate.

17. The arrangement of semiconductor memory devices as claimed in claim 16, wherein the first section of the third electrically conductive conductor track is coupled to the second section of the third electrically conductive conductor track by the plated-through hole section.

18. The arrangement of semiconductor memory devices as claimed in claim 1, wherein the first and the second semiconductor memory device each comprise at least one integrated semiconductor component.

19. The arrangement of semiconductor memory devices as claimed in claim 18, wherein the integrated semiconductor component comprises dynamic random access memory cells.

20. The arrangement of semiconductor memory devices as claimed in claim 2, wherein a filler material is provided between the top side of the flexible substrate and the underside of the first semiconductor memory device.

* * * * *